(12) United States Patent
Ando et al.

(10) Patent No.: US 9,105,745 B2
(45) Date of Patent: Aug. 11, 2015

(54) FABRICATION OF LOW THRESHOLD VOLTAGE AND INVERSION OXIDE THICKNESS SCALING FOR A HIGH-K METAL GATE P-TYPE MOSFET

(71) Applicant: International Business Machines Corporation, Armonk, NY (US)

(72) Inventors: Takashi Ando, Tuckahoe, NY (US); Changhwan Choi, Edgewater, NY (US); Martin M. Frank, Dobbs Ferry, NY (US); Unoh Kwon, Fishkill, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 396 days.

(21) Appl. No.: 13/630,235

(22) Filed: Sep. 28, 2012

(65) Prior Publication Data
US 2013/0034940 A1   Feb. 7, 2013

Related U.S. Application Data

(63) Continuation of application No. 13/195,316, filed on Aug. 1, 2011, now abandoned.

(51) Int. Cl.
*H01L 21/4763*   (2006.01)
*H01L 21/8238*   (2006.01)

(52) U.S. Cl.
CPC .............................. *H01L 21/823807* (2013.01)

(58) Field of Classification Search
CPC ................... H01L 21/823842; H01L 29/4966; H01L 29/517

USPC ........................ 439/199, 591; 438/199, 591
See application file for complete search history.

(56) References Cited

U.S. PATENT DOCUMENTS 6,797,525 B2 * 9/2004 Green et al. .................... 438/3
6,890,807 B2   5/2005 Chau et al.
(Continued)

OTHER PUBLICATIONS

Hubbard, K.J. et al., "Thermodynamic stability of binary oxides in contact with silicon", J. Mater. Res. vol. 11, No. 11, Nov. 1996, pp. 2757-2776.

(Continued)

*Primary Examiner* — Jerome Jackson, Jr.
*Assistant Examiner* — Paul Budd
(74) *Attorney, Agent, or Firm* — Harrington & Smith

(57) ABSTRACT

A method of forming a semiconductor structure. The semiconductor structure has a semiconductor substrate and an nFET and a pFET disposed upon the substrate. The pFET has a semiconductor SiGe channel region formed upon or within a surface of the semiconductor substrate and a gate dielectric having an oxide layer overlying the channel region and a high-k dielectric layer overlying the oxide layer. A gate electrode overlies the gate dielectric and has a lower metal layer abutting the high-k layer, a scavenging metal layer abutting the lower metal layer, and an upper metal layer abutting the scavenging metal layer. The metal layer scavenges oxygen from the substrate (nFET) and SiGe (pFET) interface with the oxide layer resulting in an effective reduction in $T_{inv}$ and $V_t$ of the pFET, while scaling Tinv and maintaining Vt for the nFET, resulting in the $V_t$ of the pFET becoming closer to the $V_t$ of a similarly constructed nFET with scaled $T_{inv}$ values.

10 Claims, 9 Drawing Sheets

(56) References Cited

U.S. PATENT DOCUMENTS

| | | | |
|---|---|---|---|
| 6,974,779 B2* | 12/2005 | O'Meara et al. | 438/769 |
| 7,718,496 B2 | 5/2010 | Frank et al. | |
| 7,750,418 B2 | 7/2010 | Chudzik et al. | |
| 7,754,594 B1 | 7/2010 | Chudzik et al. | |
| 7,838,908 B2 | 11/2010 | Kwon et al. | |
| 7,867,839 B2 | 1/2011 | Chen et al. | |
| 2004/0119102 A1* | 6/2004 | Chan et al. | 257/270 |
| 2004/0185198 A1 | 9/2004 | Sisson et al. | |
| 2007/0090416 A1* | 4/2007 | Doyle et al. | 257/288 |
| 2010/0133623 A1* | 6/2010 | Inumiya et al. | 257/369 |
| 2010/0187643 A1 | 7/2010 | Chudzik et al. | |
| 2010/0320547 A1 | 12/2010 | Ando et al. | |

OTHER PUBLICATIONS

Franco, J. et al., "6A EOT Si0.45Ge0.55pMOSFET with Optimized Reliability (VDD=1V): Meeting the NBTI Lifetime Target at Ultra-Thin EOT", IEEE 2010, 4 pgs.

Chudzik, M. et al., "High-Performance High-k/Metal Gates for 45nm CMOS and Beyond with Gate-First Processing", 2007 IEEE Symposium on VLSI Technology, Jun. 12-14, 2007, pp. 194-195.

Ando, T., et al., "Ultimate EOT Scaling (<5A) Using Hf-based High-k Gate Dielectrics and Impact on Carrier Mobility", ECS Transactions, 28(a), 2010, pp. 115-123.

Choi, K., et al., "Extremely Scaled Gate-First High-k/Metal Gate Stack with EOT of 0.55 nm Using Novel Interfacial Layer Scavenging Techniques for 22nm Technology Node and Beyond", Symposium on VLSI Technology Digest of Technical Papers, 2009, pp. 138-139.

Harris, H. Rusty, et al., "Band-Engineered Low PMOS VT with High-K/Metal Gates Featured in a Dual Channel CMOS Integration Scheme", Symposium on VLSI Technology Digest of Technical Papers, 2007, pp. 154-155.

Lai, C. M., et al., "A Novel 'Hybrid' High-k/Metal Gate Process for 28nm High Performance CMOSFETs", IEEE 2009, pp. 28.3.1-28.3.2.

* cited by examiner

FABRICATION OF LOW THRESHOLD VOLTAGE AND INVERSION OXIDE THICKNESS SCALING FOR A HIGH-K METAL GATE P-TYPE MOSFET

CROSS-REFERENCE TO A RELATED US PATENT APPLICATION

This patent application is a continuation of commonly assigned U.S. patent application Ser. No. 13/195,316, filed 1 Aug. 2011, entitled "Low Threshold Voltage and Inversion Oxide Thickness Scaling for a High-K Metal Fate P-Type MOSFET", by Takashi Ando; Changhwan Choi; Martin M. Frank; and Vijay Narayanan, which is incorporated by reference herewith in its entirety, and is related to commonly assigned U.S. patent application Ser. No. 12/487,248, filed 18 Jun. 2009, entitled "Scavenging Metal Stack for a High-K Gate Dielectric", by Takashi Ando; Changhwan Choi; Martin M. Frank; and Vijay Narayanan.

FIELD OF THE INVENTION

The present invention generally relates to semiconductor devices, and particularly to a metal gate stack included in an electrode over a high-k gate dielectric in a pMOSFET, and methods of manufacturing the pMOSFET.

BACKGROUND

Scaling of the gate dielectric is a challenge in improving performance of advanced field effect transistors. In a field effect transistor (FET) employing a silicon oxide based gate dielectric, the leakage current through the gate dielectric increases exponentially with the decrease in the thickness of the gate dielectric. Such devices typically become too leaky to provide high performance at or below the thickness of 1.1 nm for the silicon oxide gate dielectric.

High-k gate dielectric provides a technique to scale down the thickness of the gate dielectric without an excessive increase in the gate leakage current. However, high-k gate dielectric materials are prone to a change in the equivalent oxide thickness (EOT) because high-k gate dielectric materials react with oxygen that diffuses through the gate electrode or gate spacers. Regrowth of a silicon oxide interfacial layer between a silicon substrate and the high-k gate dielectric during high-temperature processing steps is a major obstacle to successful equivalent oxide thickness scaling. Particularly, typical stacks of a high-k gate dielectric and a metal gate are known to be susceptible to anneals at various temperatures in an oxygen ambient. Such anneals in an oxygen ambient result in regrowth of the silicon oxide interfacial layer and/or instability of the threshold voltage of field effect transistors.

In addition, the inversion oxide thickness $T_{inv}$ and pFET threshold voltage ($V_t$) show a tradeoff relationship for a high-k/metal gate stack. Reference in this regard can be made to, for example, High-Performance High-k/Metal Gates for 45 nm CMOS and Beyond with Gate-First Processing M. Chudzik et al., VLSI symposium 2007, p. 194-195.

SUMMARY

An aspect of the embodiments of this invention includes a semiconductor substrate comprising a semiconductor material; a p-type field effect transistor (pFET) disposed upon the semiconductor substrate and comprising a semiconductor channel region comprised of SiGe formed upon or within a surface of the semiconductor substrate; a gate dielectric comprising an oxide layer overlying the semiconductor channel region comprised of SiGe and a high dielectric constant (high-k) dielectric layer overlying the oxide layer; and a gate electrode overlying the high-k dielectric layer and comprising a lower metal layer abutting the high-k dielectric layer, a scavenging metal layer abutting the lower metal layer, and an upper metal layer abutting the scavenging metal layer. The scavenging metal layer includes a metal (M) for which the Gibbs free energy change of the chemical reaction, in which a silicon atom combines with a metal oxide material including the scavenging metal and oxygen to form the scavenging metal in elemental form and silicon dioxide, is positive. The structure further comprises an n-type field effect transistor (nFET) also disposed upon the semiconductor substrate and comprising a semiconductor channel region comprised of Si, where the gate electrode of the nFET also comprises the scavenging metal layer.

According to a further aspect of the embodiments of this invention there is provided a method of forming a semiconductor structure. The method comprises providing a semiconductor substrate comprising a semiconductor material; forming a p-type field effect transistor (pFET) disposed upon the semiconductor substrate and comprising a semiconductor channel region comprised of SiGe formed upon or within a surface of the semiconductor substrate; forming a gate dielectric comprising an oxide layer overlying the semiconductor channel region comprised of SiGe and a high dielectric constant (high-k) dielectric layer overlying the oxide layer; and forming a gate electrode overlying the high-k dielectric layer and comprising a lower metal layer abutting the high-k dielectric layer, a scavenging metal layer abutting the lower metal layer, and an upper metal layer abutting the scavenging metal layer. The scavenging metal layer includes a metal (M) for which the Gibbs free energy change of the chemical reaction, in which a silicon atom combines with a metal oxide material including the scavenging metal and oxygen to form the scavenging metal in elemental form and silicon dioxide, is positive. The method further comprises forming an n-type field effect transistor (nFET) to be disposed upon the semiconductor substrate and comprising a semiconductor channel region comprised of Si, where the gate electrode of the nFET also comprises the scavenging metal layer.

According to a still further aspect of the embodiments of this invention there is provided a structure that comprises a substrate; an n-type field effect transistor (nFET) disposed over the substrate and a p-type field effect transistor (pFET) disposed over the substrate. The nFET comprises a Si channel region, a gate dielectric having an oxide layer overlying the channel region, a high-k dielectric layer overlying the oxide layer, and a gate electrode overlying the gate dielectric. The gate electrode comprises a lower metal layer abutting the high-k layer, a scavenging metal layer abutting the lower metal layer, and an upper metal layer abutting the scavenging metal layer. The scavenging metal layer scavenges oxygen from an interface between the Si channel region and the oxide layer. The pFET comprises a SiGe channel region, a gate dielectric having an oxide layer overlying the channel region, a high-k dielectric layer overlying the oxide layer, and a gate electrode overlying the gate dielectric. The gate electrode comprises a lower metal layer abutting the high-k layer, a scavenging metal layer abutting the lower metal layer, and an upper metal layer abutting the scavenging metal layer. The scavenging metal layer scavenges oxygen from an interface between the SiGe channel region and the oxide layer.

DETAILED DESCRIPTION

Figure 1:
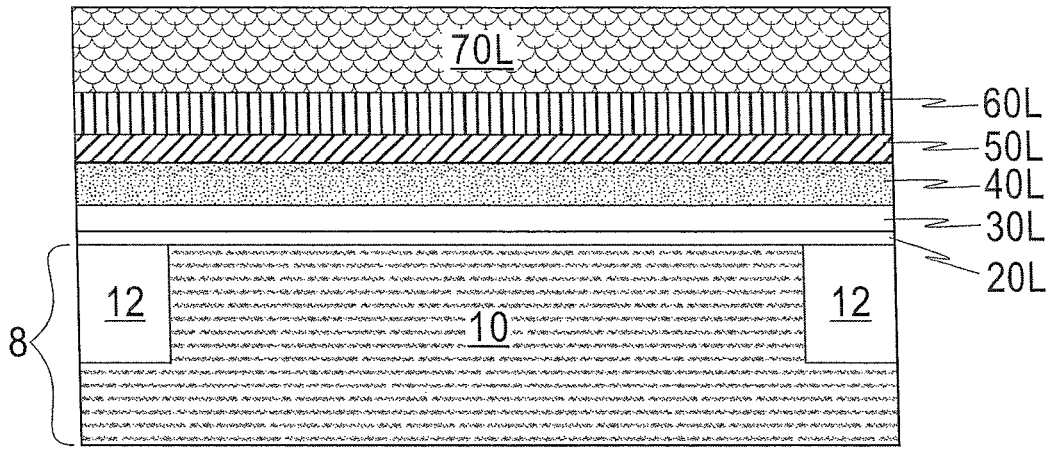
FIG. 1 is a vertical cross-sectional view of a first exemplary semiconductor structure after formation of a high-k dielectric layer, a lower metal layer, a scavenger metal layer, an upper metal layer, and a polycrystalline semiconductor layer.

A SiGe channel is effective to lower pFET $V_t$ but is accompanied with an increase in $T_{inv}$ resulting in a $T_{inv}$ delta between an nFET and the pFET. Reference in this regard can be made, for example, to Band-Engineering Low PMOS Vt with High-k/Metal Gates Featured in a Dual Channel CMOS Integration Scheme, H. Rusty Harris et al., VLSI symposium 2007, p. 154-155.

Metal-induced interfacial layer scavenging is effective for $T_{inv}$ scaling, however the impact on $V_t$ is basically negligible for a Si channel.

The exemplary embodiments of this invention provide a technique that enables $T_{inv}$ scaling and $V_t$ lowering simultaneously for a pFET, while scaling $T_{inv}$ and maintaining $V_t$ for an nFET.

An aspect of the embodiments of this invention deposits a metal doped TiN electrode on an nFET area with a Si channel and also on a pFET area with a SiGe channel. A further aspect of this invention deposits a Ti-rich TiN/M/TiN electrode on a high-k gate dielectric, where M: Metal (M) for which the Gibbs free energy change of the chemical reaction, in which a silicon atom combines with a metal oxide material including the scavenging metal and oxygen to form the scavenging metal in elemental form and silicon dioxide, is positive. In these embodiments the nFET active area contains a Si channel while the pFET active area contains a SiGe or a Ge channel. A conventional self-aligned gate-first process can then be performed after the metal doped TiN deposition process is completed. The metal M of the TiN/M/TiN electrode serves to scavenge oxygen from a SiGe interface with an overlying dielectric layer (e.g., $SiO_2$) resulting in an effective reduction in $T_{inv}$ and $V_t$ of the pFET. This beneficially permits the $V_t$ of the pFET to be made similar to the $V_t$ of the nFET.

The embodiments of this invention can use to advantage a process disclosed in commonly assigned U.S. patent application Ser. No. 12/487,248, filed 18 Jun. 2009, entitled "Scavenging Metal Stack for a High-K Gate Dielectric", Takashi Ando; Changhwan Choi; Martin M. Frank; and Vijay Narayanan (US Patent Publication 2010/00320547 A1). A description of this technique will be provided first with reference to FIGS. 1-6, in which corresponding elements are referred to by like reference numerals. The Figures are not drawn to scale.

As is described in commonly assigned U.S. patent application Ser. No. 12/487,248, a stack of a high-k gate dielectric and a metal gate structure includes a lower metal layer, a scavenging metal layer, and an upper metal layer. The scavenging metal layer meets the following two criteria 1) a metal (M) for which the Gibbs free energy change of the chemical reaction, in which a silicon atom combines with a metal oxide material including the scavenging metal and oxygen to form the scavenging metal in elemental form and silicon dioxide, is positive. 2) a metal that has a more negative Gibbs free energy per oxygen atom for formation of oxide than the material of the lower metal layer and the material of the upper metal layer. The scavenging metal layer meeting these criteria captures oxygen atoms as the oxygen atoms diffuse through the gate electrode toward the high-k gate dielectric. In addition, the scavenging metal layer remotely reduces the thickness of a silicon oxide interfacial layer underneath the high-k dielectric. As a result, the equivalent oxide thickness (EOT) of the total gate dielectric is reduced and the field effect transistor formed on a Si channel maintains a constant threshold voltage even after high temperature processes during CMOS integration.

Referring to FIG. 1, an exemplary semiconductor structure comprises a semiconductor substrate 8 and a stack of material layers formed thereupon. The semiconductor substrate 8 contains a substrate semiconductor layer 10 and shallow trench isolation structures 12. The substrate semiconductor layer 10 has a semiconductor material, which may be selected from, but is not limited to, silicon, silicon carbon alloy, gallium arsenide, indium arsenide, indium phosphide, III-V compound semiconductor materials, II-VI compound semiconductor materials, organic semiconductor materials, and other compound semiconductor materials. Typically, the semiconductor material of the substrate semiconductor layer 10 comprises silicon, and more typically, the semiconductor material of the substrate semiconductor layer 10 is silicon.

In case the semiconductor material of the substrate semiconductor layer 10 is a single crystalline silicon-containing semiconductor material, the single crystalline silicon-containing semiconductor material is preferably selected from single crystalline silicon, a single crystalline silicon carbon alloy, a single crystalline silicon germanium alloy, and a single crystalline silicon germanium carbon alloy.

The semiconductor material of the substrate semiconductor layer 10 may be appropriately doped either with p-type dopant atoms or with n-type dopant atoms. The dopant concentration of the substrate semiconductor layer 10, and may be from $1.0 \times 10^{15}/cm^3$ to $1.0 \times 10^{19}/cm^3$, and typically from $1.0 \times 10^{16}/cm^3$ to $3.0 \times 10^{18}/cm^3$, although lesser and greater dopant concentrations are contemplated herein also. Preferably, the substrate semiconductor layer 10 is single crystalline. The semiconductor substrate 8 may be a bulk substrate, a semiconductor-on-insulator (SOI) substrate, or a hybrid substrate. The semiconductor substrate 8 may, or may not, have a built-in stress in the substrate semiconductor layer 10. While the process is described below with a bulk substrate, implementation of the process on an SOI substrate or on a hybrid substrate is explicitly contemplated herein. The shallow trench isolation structure 12 comprises a dielectric material such as silicon oxide or silicon nitride, and is formed by methods well known in the art.

An unpatterned chemical oxide layer 20 may be formed on the exposed semiconductor surface of the substrate semiconductor layer 10. An unpatterned high dielectric constant (high-k) dielectric layer 30 is formed directly on the top surface of the unpatterned chemical oxide layer 20. Even in the case the unpatterned chemical oxide layer 20 is not formed, the deposition of the unpatterned high dielectric constant (high-k) dielectric layer 30 and subsequent thermal processes lead to the formation of pre-existing interfacial layer between the substrate semiconductor layer 10 and the unpatterned high dielectric constant (high-k) dielectric layer 30. The unpatterned chemical oxide layer 20 may be formed by treatment of exposed semiconductor surfaces with a chemical. For example, the process step for this wet chemical oxidation may include treating a cleaned semiconductor surface (such as a semiconductor surface treated with hydrofluoric acid) with a mixture of ammonium hydroxide, hydrogen peroxide and water (in a 1:1:5 ratio) at a room temperature. Alternately, the chemical oxide layer can also be formed by treating the HF-last semiconductor surface in ozonated aqueous solutions, with the ozone concentration usually varying from, but not limited to: 2 parts per million (ppm) to 40 ppm. The unpatterned chemical oxide layer 20 helps minimize mobility degradation in the substrate semiconductor layer 10 due to high-k dielectric material in the unpatterned high-k dielectric layer 30. However, the thickness of the unpatterned chemical oxide layer 20 is thicker than necessary and increases the equivalent oxide thickness (EOT) of a composite dielectric stack, which includes the unpatterned chemical oxide layer 20 and the unpatterned high-k dielectric layer 30. The scalability of EOT is limited by the thickness of the unpatterned chemical oxide layer 20. In case the substrate semiconductor layer is a silicon layer, the unpatterned chemical oxide layer 20 is a silicon oxide layer. Typically, the thickness of the unpatterned chemical oxide layer 20 is from 0.1 nm to 0.4 nm, although lesser and greater thicknesses are also contemplated herein.

A high dielectric constant (high-k) dielectric layer 30 is formed on a top surface of the semiconductor substrate 8 over the chemical oxide layer 20. The unpatterned high-k dielectric layer 30 comprises a high dielectric constant (high-k) material comprising a dielectric metal oxide and having a dielectric constant that is greater than the dielectric constant of silicon nitride of 7.5. The unpatterned high-k dielectric layer 30 may be formed by methods well known in the art including, for example, chemical vapor deposition (CVD), atomic layer deposition (ALD), molecular beam deposition (MBD), pulsed laser deposition (PLD), liquid source misted chemical deposition (LSMCD), etc.

The dielectric metal oxide comprises a metal and oxygen, and optionally nitrogen and/or silicon. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the unpatterned high-k dielectric layer 30 may be from 1 nm to 10 nm, and preferably from 1.5 nm to 3 nm. The unpatterned high-k dielectric layer 30 may have an effective oxide thickness (EOT) on the order of, or less than, 1 nm.

An unpatterned lower metal layer 40 is deposited directly on the top surface of the unpatterned high-k dielectric layer 30. The unpatterned lower metal layer 40 may be formed, for example, by chemical vapor deposition (CVD), physical vapor deposition (PVD), or atomic layer deposition (ALD).

The material of the unpatterned lower metal layer 40 is herein referred to as a "first metallic compound" which may be a conductive transition metal nitride or a conductive transition metal carbide. The first metallic compound is a compound of a first metallic element selected from transition metals and a non-metallic element. If the non-metallic element is nitrogen, the first metallic compound is a transition metal nitride. If the non-metallic element is carbon, the first metallic compound is a transition metal carbide. For example, the first metallic compound may be selected from TiN, TiC, TaN, TaC, and a combination thereof. As used herein, transition metals include elements from Group 3B, 4B, 5B, 6B, 7B, 8B, 1B, and 2B and Lanthanides and Actinides in the Periodic Table of the Elements. The thickness of the unpatterned lower metal layer 40 may be from 1 nm to 10 nm, and preferably from 3 nm to 10 nm, although lesser and greater thicknesses are also contemplated herein.

An unpatterned scavenging metal layer 50 is deposited directly on the top surface of the unpatterned lower metal layer 40. The unpatterned scavenging metal layer 50 may be formed, for example, by chemical vapor deposition (CVD), physical vapor deposition (PVD), or atomic layer deposition (ALD). Preferably, the first exemplary semiconductor structure is transferred from a processing chamber that deposits the unpatterned lower metal layer 40 to another processing chamber that deposits the unpatterned scavenging metal layer 50 without breaking vacuum to prevent formation of any interfacial layer by oxidation or introduction of oxygen into the unpatterned lower metal layer 40.

The material of the unpatterned scavenging metal layer 50 "scavenges" impurity oxygen from neighboring metallic layers during subsequent processing. For the unpatterned scavenging metal layer 50 to effectively scavenge impurity oxygen in subsequent processing steps, it is necessary that introduction of oxygen into the unpatterned scavenging metal layer 50 is suppressed during the formation step. Further, it is necessary to select the material for the unpatterned scavenging metal layer 50 so that the material of the unpatterned scavenging metal layer 50 effectively scavenges impurity oxygen atoms from the unpatterned lower metal layer 40 and an unpatterned upper metal layer 60 to be subsequently formed.

The unpatterned scavenging metal layer 50 may include a metal in an elemental form. Typical elemental metals that may be selected for the unpatterned scavenging metal layer 50 include, but are not limited to, Al, Be, Mg, Ca, Sr, Ba, Sc, Y, La, Ti, Zr, Hf, Dy, Lu, Er, Pr, and Ce. In one embodiment, the unpatterned scavenging metal layer 50 consists of at least one alkaline earth metal. In another embodiment, the unpatterned scavenging metal layer 50 consists of at least one transition metal. In yet another embodiment, the unpatterned scavenging metal layer 50 consists of a mixture of at least one alkaline earth metal and at least one transition metal. Preferably, the thickness of the unpatterned scavenging metal layer 50 may be from 0.1 nm to 3.0 nm, although lesser and greater thicknesses are also contemplated herein.

An unpatterned upper metal layer 60 is deposited directly on the top surface of the unpatterned scavenging metal layer 50. The unpatterned upper metal layer 60 may be formed, for example, by chemical vapor deposition (CVD), physical vapor deposition (PVD), or atomic layer deposition (ALD). Preferably, the first exemplary semiconductor structure is transferred from the processing chamber that deposits the unpatterned scavenging metal layer 50 to a processing chamber that deposits the unpatterned upper metal layer 60 without breaking vacuum to prevent formation of any interfacial layer by oxidation or introduction of oxygen into the unpatterned scavenging metal layer 50.

The material of the unpatterned upper metal layer 60 is herein referred to as a "second metallic compound" which may be a conductive transition metal nitride or a conductive transition metal carbide. The second metallic compound is a compound of a second metallic element selected from transition metals and a non-metallic element. If the non-metallic element is nitrogen, the second metallic compound is a transition metal nitride. If the non-metallic element is carbon, the second metallic compound is a transition metal carbide. For example, the second metallic compound may be selected from TiN, TiC, TaN, TaC, and a combination thereof. The thickness of the unpatterned upper metal layer 60 may be from lower from 1 nm to 100 nm, and preferably from 3 nm to 10 nm, although lesser and greater thicknesses are also contemplated herein.

In one case, the first metallic compound and the second metallic compound are the same material. In another case, the first metal compound and the second metal compound are different materials.

In one embodiment, the material for the unpatterned scavenging metal layer 50 is selected such that Gibbs free energy per oxygen atom for formation of an oxide for the unpatterned scavenging metal layer 50 is equal to or more negative than Gibbs free energy per oxygen atom for formation of an oxide of the first elemental metal within the first metallic compound for the unpatterned lower metal layer 40. Further, the material for the unpatterned scavenging metal layer 50 is selected such that Gibbs free energy per oxygen atom for formation of an oxide for the unpatterned scavenging metal layer 50 is equal to or more negative than Gibbs free energy per oxygen atom for formation of an oxide of the second elemental metal within the second metallic compound for the unpatterned upper metal layer 60.

For example, the first and second metallic compounds may be selected from TiN, TiC, TaN, TaC, and a combination thereof. The unpatterned scavenging metal layer 50 includes at least one of Al, Be, Mg, Ca, Sr, Ba, Sc, Y, La, Ti, Zr, Hf, Dy, Lu, Er, Pr, and Ce.

In another embodiment, the material for the unpatterned scavenging metal layer 50 is selected such that Gibbs free energy per oxygen atom for formation of an oxide for the unpatterned scavenging metal layer 50 is more negative than Gibbs free energy per oxygen atom for formation of an oxide of the first elemental metal within the first metallic compound for the unpatterned lower metal layer 40. Further, the material for the unpatterned scavenging metal layer 50 is selected such that Gibbs free energy per oxygen atom for formation of an oxide for the unpatterned scavenging metal layer 50 is more negative than Gibbs free energy per oxygen atom for formation of an oxide of the second elemental metal within the second metallic compound for the unpatterned upper metal layer 60.

In one illustrative example according to this embodiment, each of the first metallic compound and the second metallic compound may be selected from TaN, TaC, and a combination thereof. Because titanium (Ti) has a more negative Gibbs free energy per oxygen atom for formation of an oxide than tantalum (Ta), the unpatterned scavenging metal layer 50 may comprise a metal in an elemental form and selected from Al, Be, Mg, Ca, Sr, Ba, Sc, Y, La, Ti, Zr, Hf, Dy, Lu, Er, Pr, and Ce in this illustrative example.

In another illustrative example according to this embodiment, at least one of the first metallic compound and the second metallic compound may be selected from TiN, TiC, and a combination thereof. The unpatterned scavenging metal layer 50 may include a metal in an elemental form and selected from Al, Be, Mg, Ca, Sr, Ba, Sc, Y, La, Zr, Hf, Dy, Lu, Er, Pr, and Ce in this illustrative example.

In a preferred example, the first metallic compound of the unpatterned lower metal layer 40 and the second metallic compound of the unpatterned upper metal layer 60 are TiN and the unpatterned scavenging metal layer 50 is an aluminum layer including aluminum in elemental metal form.

Not necessarily but preferably, an unpatterned polycrystalline semiconductor layer 70 is deposited directly on the top surface of the unpatterned upper metal layer 60, for example, by low pressure chemical vapor deposition (LPCVD), rapid thermal chemical vapor deposition (RTCVD), or plasma enhanced chemical vapor deposition (PECVD). The unpatterned polycrystalline semiconductor layer 70 may comprise polysilicon, a polycrystalline silicon germanium alloy, a polycrystalline silicon carbon alloy, or a polycrystalline silicon germanium carbon alloy. The unpatterned polycrystalline semiconductor layer 70 may be formed as a doped polycrystalline semiconductor layer through in-situ doping. Alternately, the unpatterned polycrystalline semiconductor layer 70 may be doped by ion implantation of dopant atoms after deposition of the unpatterned polycrystalline semiconductor layer 70 and prior to patterning of a gate electrode. Yet alternately, implantation of dopant ions may be performed on a remaining portion of the unpatterned polycrystalline semiconductor layer 70 after patterning of the gate electrode. The thickness of the unpatterned polycrystalline semiconductor layer 70 may be from 10 nm to 300 nm, and typically from 50 nm to 100 nm, although lesser and greater thicknesses are also contemplated herein. Embodiments in which the unpatterned polycrystalline semiconductor layer 70 is not formed and the stack of the unpatterned lower metal layer 40, unpatterned scavenging metal layer 50, and unpatterned upper metal layer 60 constitute a gate electrode layer.

A photoresist layer (not shown) is applied to the top surface of the unpatterned polycrystalline semiconductor layer 70 and lithographically patterned to form a photoresist portion 77 (See FIG. 2), which has the shape of a gate electrode to be subsequently formed. The pattern in the photoresist portion 77 is transferred into the stack of the unpatterned polycrystalline semiconductor layer 70, the unpatterned upper metal layer 60, the unpatterned scavenging metal layer 50, the unpatterned lower metal layer 40, the unpatterned high-k dielectric layer 30, and the unpatterned chemical oxide layer 20. The pattern transfer may be effected by an anisotropic etch that employs the photoresist portion 77 as an etch mask.

Figure 2:
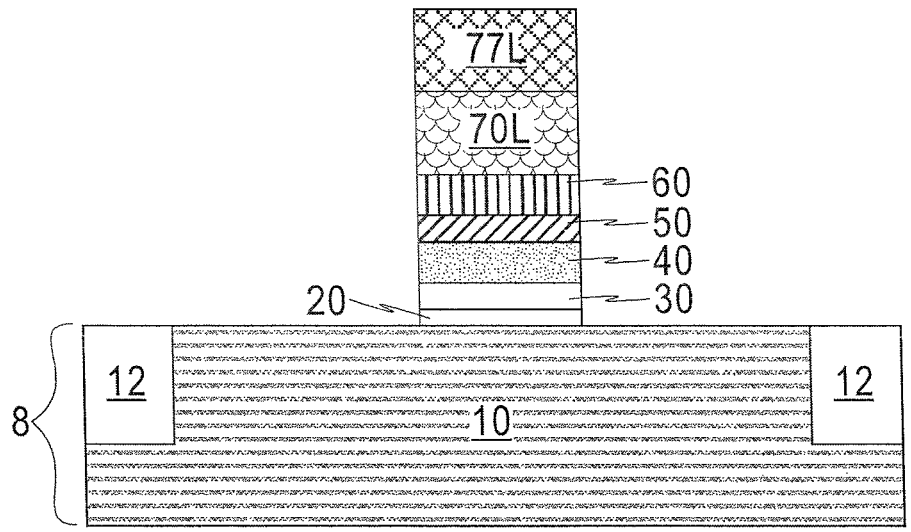
FIG. 2 is a vertical cross-sectional view of the first exemplary semiconductor structure after patterning of a gate dielectric and a gate electrode.

Referring to FIG. 2, the remaining portions of the unpatterned polycrystalline semiconductor layer 70, the unpatterned upper metal layer 60, the unpatterned scavenging metal layer 50, the unpatterned lower metal layer 40 constitute a gate electrode, which include a polycrystalline semiconductor layer 70, an upper metal layer 60, a scavenging metal layer 50, and lower metal layer 40. The gate electrode (40, 50, 60, 70) is typically patterned as a line having a width, which is the width of the lower metal layer 40 as shown in FIG. 2 and is referred to as a "gate length." The gate length depends on the device characteristics and may be from the lithographically printable smallest dimension to 10 microns. Typically, the gate length is from 32 nm to 1 micron, although lesser and greater gate lengths are also contemplated herein.

The remaining portion of the unpatterned high-k dielectric layer 30 is herein referred to as a high-k dielectric layer 30, and the remaining portion of the unpatterned chemical oxide layer 20 is herein referred to as a chemical oxide layer 20. The high-k dielectric layer 30 and the chemical oxide layer 20 collectively constitute a gate dielectric (20, 30). Typically, the gate dielectric (20, 30) has an equivalent oxide thickness (EOT) less than 1.2 nm, and may have an EOT less than 1.0 nm. The photoresist portion 77 is subsequently removed, for example, by ashing.

The sidewalls of the gate electrode (40, 50, 60, 70) and the gate dielectric (20, 30) are typically substantially vertical, i.e., parallel to the surface normal of the exposed surface of the substrate semiconductor layer 10. Further, the sidewalls of the gate electrode (40, 50, 60, 70) and the gate dielectric (20, 30) are typically substantially vertically coincident with each other.

Figure 3:
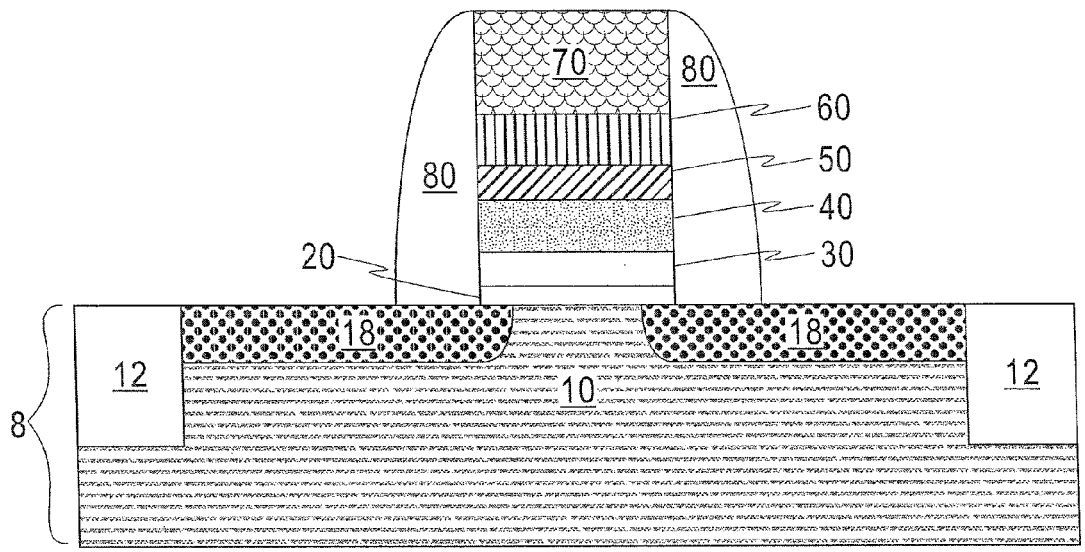
FIG. 3 is a vertical cross-sectional view of the first exemplary semiconductor structure after formation of a gate spacer and source and drain extension regions.

Referring to FIG. 3, source and drain extension regions 18 are formed by ion implantation that employs the gate electrode (40, 50, 60, 70) and the gate dielectric (20, 30) as an implantation mask. The source and drain extension regions 18 have a doping of the opposite conductivity type of the doping of the substrate semiconductor layer 10. For example, if the substrate semiconductor layer 10 has a p-type doping, the source and drain extension regions 18 have an n-type doping, and vice versa. The dopant concentration of the source and drain extension regions 18 may be from $1.0 \times 10^{19}/cm^3$ to $1.0 \times 10^{21}/cm^3$, although lesser and greater dopant concentrations are contemplated herein also. Each of the source and drain extension regions 18 abut peripheral portions of the gate dielectric (20, 30).

Optionally, a halo implantation may be performed at this step to introduce dopants of the same conductivity type as the doping of the substrate semiconductor layer 10 to volumes of the substrate semiconductor layer 10 located underneath peripheral portions of the gate electrode (40, 50, 60, 70) and the gate dielectric (20, 30).

A gate spacer 80 laterally abutting the sidewalls of the gate electrode (40, 50, 60, 70) and the sidewalls of the gate dielectric (20, 30) is formed, for example, by deposition of a conformal dielectric material layer followed by an anisotropic ion etching. The portion of the dielectric material layer that is formed directly on the sidewalls of the gate electrode (40, 50, 60, 70) and the gate dielectric (20, 30) remain after the anisotropic etch to constitute a gate spacer 80 that laterally surrounds the gate electrode (40, 50, 60, 70) and the gate dielectric (20, 30). Preferably, the gate spacer 80 includes an oxygen-impermeable material such as silicon nitride.

Figure 4:
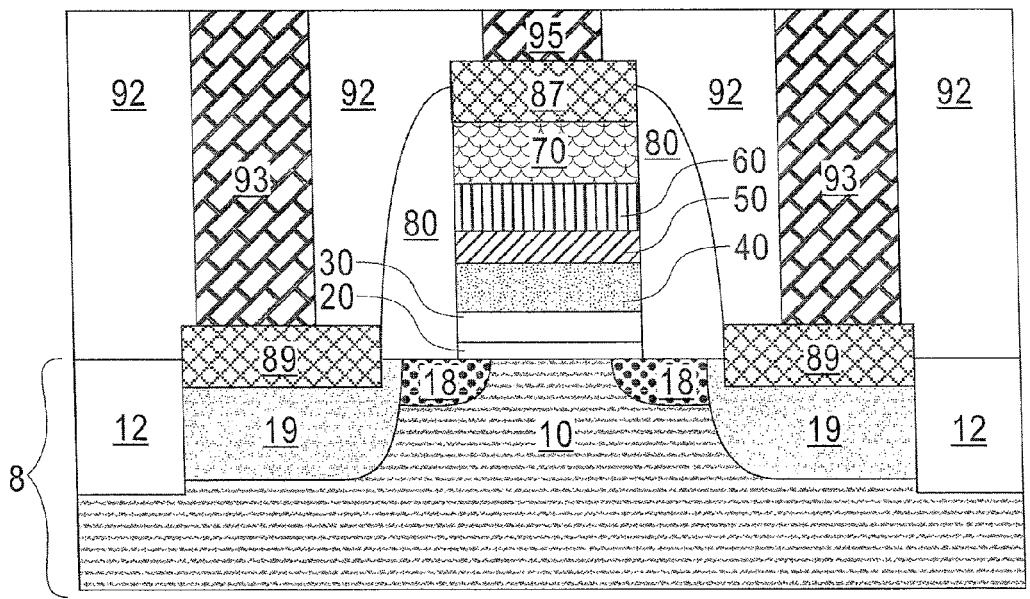
FIG. 4 is a vertical cross-sectional view of the first exemplary semiconductor structure after formation of silicide regions, a dielectric material layer, and contact vias.

Referring to FIG. 4, source and drain regions 19 are formed by ion implantation that employs the gate electrode (40, 50, 60, 70) and the gate spacer 80 as an implantation mask. The source and drain regions 19 have a doping of the same conductivity type as the doping of the source and drain extension regions 18. The dopant concentration of the source and drain regions 19 may be from $1.0 \times 10^{19}/cm^3$ to $1.0 \times 10^{21}/cm^3$, although lesser and greater dopant concentrations are contemplated herein also.

An activation anneal is thereafter performed to activate electrical dopants implanted within the source and drain extension regions 18 and the source and drain regions 19. Such an activation anneal is typically performed in an oxidizing ambient during which the compositional integrity of the high-k dielectric layer may be compromised in prior art semiconductor structures. In the present invention, however, the thickening of the chemical oxide layer 20, if present, is prevented in the exemplary semiconductor structure in FIG. 4 because the scavenging metal layer 50 consumes oxygen that diffused downward from the polycrystalline semiconductor layer 70. In case a chemical oxide layer 20 is absent in the exemplary structure of the present invention, formation of an interfacial semiconductor oxide layer between the substrate semiconductor layer 10 and the high-k dielectric layer 30 is prevented by the same mechanism.

Therefore, the flat band voltage of the structure including the substrate semiconductor layer 10, the gate dielectric (20, 30), and the lower metal gate 40 is not affected during the activation anneal or in any other thermal processing step in an oxidizing ambient.

A metal layer (not shown) is formed over the entire exposed top surfaces of the exemplary semiconductor structure and reacted with exposed semiconductor materials to form various metal semiconductor alloy regions. The metal layer comprises a metal that reacts with the semiconductor material in the source and drain regions 19 and the polycrystalline semiconductor layer 70. Non-limiting exemplary materials for the metal layer include nickel, platinum, palladium, cobalt or a combination thereof. The formation of the metal layer may be effected by physical vapor deposition (PVD), chemical vapor deposition (CVD), or atomic layer deposition (ALD). The metal layer may be deposited in a conformal or non-conformal manner. Preferably, the metal deposition is substantially conformal.

The exposed semiconductor surfaces in direct contact with the metal layer are metallized by reacting with the metal in the metal layer during a metallization anneal. The metallization is effected by an anneal at a temperature from 350° C. to 550° C., which is typically performed in an inert gas atmosphere, e.g., He, Ar, $N_2$, or forming gas. Preferably, the anneal is performed at a temperature from 400° C. to 500° C. A continuous heating at a constant temperature or various ramping in temperature may be employed. The metallization may further be effected by an additional anneal at a temperature from 400° C. to 750° C., and preferably from 500° C. to 700° C. After the metallization process, unreacted portions of the metal layer, which are present over dielectric surfaces such as the gate spacer 80 and the shallow trench isolation structures 12, are removed selective to various metal semiconductor alloy portions by an etch, which may be a wet etch. A typical etchant for such a wet etch employs aqua regia.

The metallization forms source and drain metal semiconductor alloy regions 89 directly on each of the source and drain regions 19. Further, a gate metal semiconductor alloy region 87 is formed directly on the top surface of the polycrystalline semiconductor layer 70.

A dielectric material layer 92 is deposited over the entirety of the top surfaces of the exemplary semiconductor structure. The dielectric material layer 60 comprises a dielectric material such as silicon oxide, silicon nitride, silicon oxynitride, or a combination thereof.

Preferably, the dielectric material layer 60 includes a mobile ion barrier layer (not shown). The mobile ion barrier layer typically comprises an impervious dielectric material such as silicon nitride and directly contacts the various metal semiconductor alloy regions (89, 87). The dielectric material layer 60 may additionally include, for example, a spin-on-glass and/or chemical vapor deposition (CVD) oxide such as undoped silicate glass (USG), borosilicate glass (BSG), phosphosilicate glass (PSG), fluorosilicate glass (FSG), borophosphosilicate glass (BPSG), or a combination thereof. Alternately, the dielectric material layer 60 may comprise a low-k dielectric material having a dielectric constant less than 3.9 (the dielectric constant of silicon oxide), and preferably less than 2.5. Exemplary low-k dielectric materials include organosilicate glass (OSG) and SiLK™.

The dielectric material layer 60 is subsequently planarized to form a substantially planar top surface. Source and drain contact vias 93 and a gate contact via 95 are formed through the dielectric material layer 60 to provide electrical contact to the source and drain regions 19, respectively, and to the gate electrode (40, 50, 60, 70).

The exemplary semiconductor structure in FIG. 4 functions as a field effect transistor having a high-k gate dielectric and a metal gate. The presence of the scavenging metal layer 50 within the gate electrode (40, 50, 60, 70) prevents oxygen atoms that diffuse down the polycrystalline semiconductor layer 70 from passing into the lower metal layer 40 because the oxygen atoms are scavenged by the scavenging metal layer 50. Therefore, the field effect transistor provides a superior reliability against oxygen diffusion that may degrade or alter the device parameters of the field effect transistor.

Figure 5:
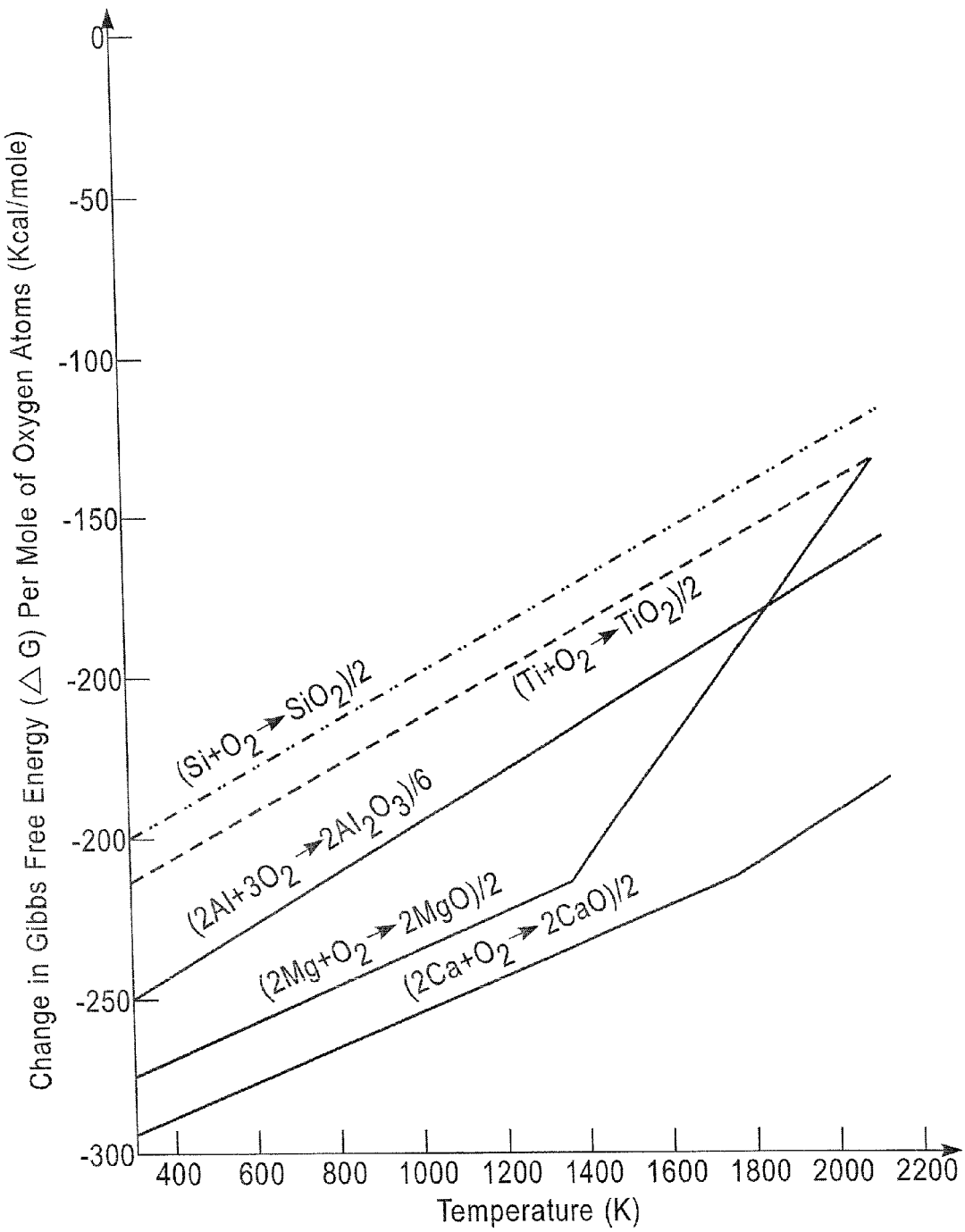
FIG. 5 is a graph showing the amount of change in Gibbs free energy during oxidation of various metals.

Referring to FIG. 5, the amount of change in Gibbs free energy per oxygen atom during oxidation of various metals is shown within a temperature range from 300 K to 2,200 K. When a reaction having a more negative change in Gibbs free energy per oxygen atom competes with another reaction having a less negative change in Gibbs free energy per oxygen atom for a limited supply of reactants, the reaction with the more negative change in Gibbs free energy dominates the reaction and consumes a prevailing majority of the available reactants. In the case of oxidation reactions within the gate electrode (40, 50, 60, 70, See FIG. 4) during a high temperature anneal in an oxidizing ambient, oxygen atoms or oxygen molecules that diffuse through the polycrystalline semiconductor layer 70 (See FIG. 4) and the upper metal layer 60 (See FIG. 4) are the reactants that are supplied in a limited quantity. Within the temperature range of the activation anneal, which is typically performed at about 1,000° C., or about 1,300 K, elemental metals such as Al, Be, Mg, Ca, Sr, Ba, Sc, Y, La, Zr, Hf, Dy, Lu, Er, Pr, and Ce have more negative changes in Gibbs free energy relative to typical transition metals such as Ti and Ta. Therefore, elemental metals such as Al, Be, Mg, Ca, Sr, Ba, Sc, Y, La, Zr, Hf, Dy, Lu, Er, Pr, and Ce effectively function as the scavenging material for the scavenging metal layer 50 (See FIG. 4).

The Gibbs free energy changes for some selected elemental metal atoms by reaction $Si + 2/y\ M_xO_y \rightarrow 2x/y\ M + SiO_2$ are given in Table 1.

and a polycrystalline semiconductor layer formed directly thereupon according to the prior art. A second curve 620 shows the capacitance for an exemplary gate electrode according to the present invention that includes a stack, from bottom to top, of a 3.5 nm thick TiN layer as a lower metal layer, a 1.0 nm Ti layer as a scavenging metal layer, a 3.5 nm thick TiN layer an upper metal layer, and a polycrystalline semiconductor layer. A third curve 630 shows the capacitance for another exemplary gate electrode according to the present invention that includes a stack, from bottom to top, of a 3.5 nm thick TiN layer as a lower metal layer, a 1.0 nm Al layer as a scavenging metal layer, a 3.5 nm thick TiN layer an upper metal layer, and a polycrystalline semiconductor layer. A fourth curve 640 shows the capacitance for an counterexample gate electrode that was formed against the teaching of the instant invention by includes a stack, from bottom to top, of a 3.5 nm thick TiN layer as a lower metal layer, a 1.0 nm Ta layer as a scavenging metal layer, a 3.5 nm thick TiN layer an upper metal layer, and a polycrystalline semiconductor layer. Ta has less decrease in Gibbs free energy than Ti so that use of Ta as a scavenging material layer should be avoided if the lower metal layer and the upper metal layer include TiN according to the present invention. Thus, the structure of the counterexample gate electrode is not desirable. A $HfO_2$ layer was employed as a high-k dielectric layer, which was formed between a substrate semiconductor layer and each gate electrode. All four gate electrode structures were subjected to an activation anneal at a temperature about 1,000° C. in an oxidizing ambient.

Comparison of the four curves (610, 620, 630) show that the effective capacitance achieved by the gate stacks as described in commonly assigned U.S. patent application Ser. No. 12/487,248, as demonstrated by the second and third curves (620, 630), is greater than the capacitance achieved by the reference gate stack, as demonstrated by the first curve 610. Thus, the equivalent oxide thickness (EOT) achieved by the gate stacks of the invention described in commonly assigned U.S. patent application Ser. No. 12/487,248 is less than the EOT achieved by the reference gate stack, providing

TABLE 1

The Gibbs free energy change at 1000K for the reaction $Si + 2/y\ M_xO_y \rightarrow 2x/y\ M + SiO_2$, wherein M is the elemental metal.

| Oxide | $Li_2O$ | $Na_2O$ | $K_2O$ | BeO | MgO | CaO | SrO | BaO |
|---|---|---|---|---|---|---|---|---|
| ΔG | +24.298 | −20.061 | −33.749 | +32.405 | +30.572 | +39.914 | +30.821 | +21.338 |
| Oxide | $Sc_2O_3$ | $Y_2O_3$ | $La_2O_3$ | $Ce_2O_3$ | $CeO_2$ | $Pr_2O_3$ | $PrO_2$ | $Nd_2O_3$ |
| ΔG | +123.11 | +116.82 | +98.470 | +104.95 | +36.209 | +105.76 | +13.559 | +101.69 |
| Oxide | $Sm_2O_3$ | EuO | $Eu_2O_3$ | $Gd_2O_3$ | $Tb_2O_3$ | $TbO_{1.72}$ | $Dy_2O_3$ | $Ho_2O_3$ |
| ΔG | +103.94 | +33.238 | +61.901 | +101.55 | +114.76 | +38.273 | +112.44 | +118.45 |
| Oxide | $Er_2O_3$ | $Tm_2O_3$ | $Yb_2O_3$ | $Lu_2O_3$ | $ThO_2$ | $UO_2$ | TiO | $Ti_2O_3$ |
| ΔG | +112.03 | +116.65 | +103.83 | +116.97 | +75.513 | +43.670 | +17.749 | +35.432 |
| Oxide | $TiO_2$ | $ZrO_2$ | $HfO_2$ | VO | $V_2O_3$ | $VO_2$ | NbO | $NbO_2$ |
| ΔG | +7.527 | +42.326 | +47.648 | −5.314 | −30.197 | −43.280 | −10.132 | −13.872 |
| Oxide | $Nb_2O_5$ | $Ta_2O_5$ | $Cr_2O_3$ | $MoO_2$ | $MoO_3$ | $WO_2$ | $WO_{2.72}$ | $WO_3$ |
| ΔG | −86.228 | −52.533 | −55.275 | −76.902 | −143.78 | −77.126 | −107.20 | −121.81 |
| Oxide | MnO | $Mn_3O_4$ | $Mn_2O_3$ | $TcO_2$ | $ReO_2$ | FeO | $Fe_3O_4$ | $Fe_2O_3$ |
| ΔG | −12.752 | −100.60 | −94.689 | −112.91 | −126.66 | −37.774 | −160.08 | −127.47 |
| Oxide | $RuO_2$ | $OsO_2$ | CoO | $Rh_2O_3$ | $IrO_2$ | NiO | PdO | $Cu_2O$ |
| ΔG | −142.27 | −147.25 | −48.041 | −235.15 | −159.47 | −51.377 | −86.066 | −64.284 |
| Oxide | CuO | ZnO | CdO | $Al_2O_3$ | $Ga_2O_3$ | $In_2O_3$ | $GeO_2$ | SnO |
| ΔG | −71.375 | −28.461 | −49.433 | +63.399 | −79.411 | −117.72 | −82.124 | −43.514 |
| Oxide | $SnO_2$ | PbO | $Pb_3O_4$ | $PbO_2$ | $SbO_2$ | $Bi_2O_3$ | $TeO_2$ | |
| ΔG | −84.977 | −59.249 | −269.62 | −155.79 | −110.52 | −191.85 | −140.95 | |

Figure 6:
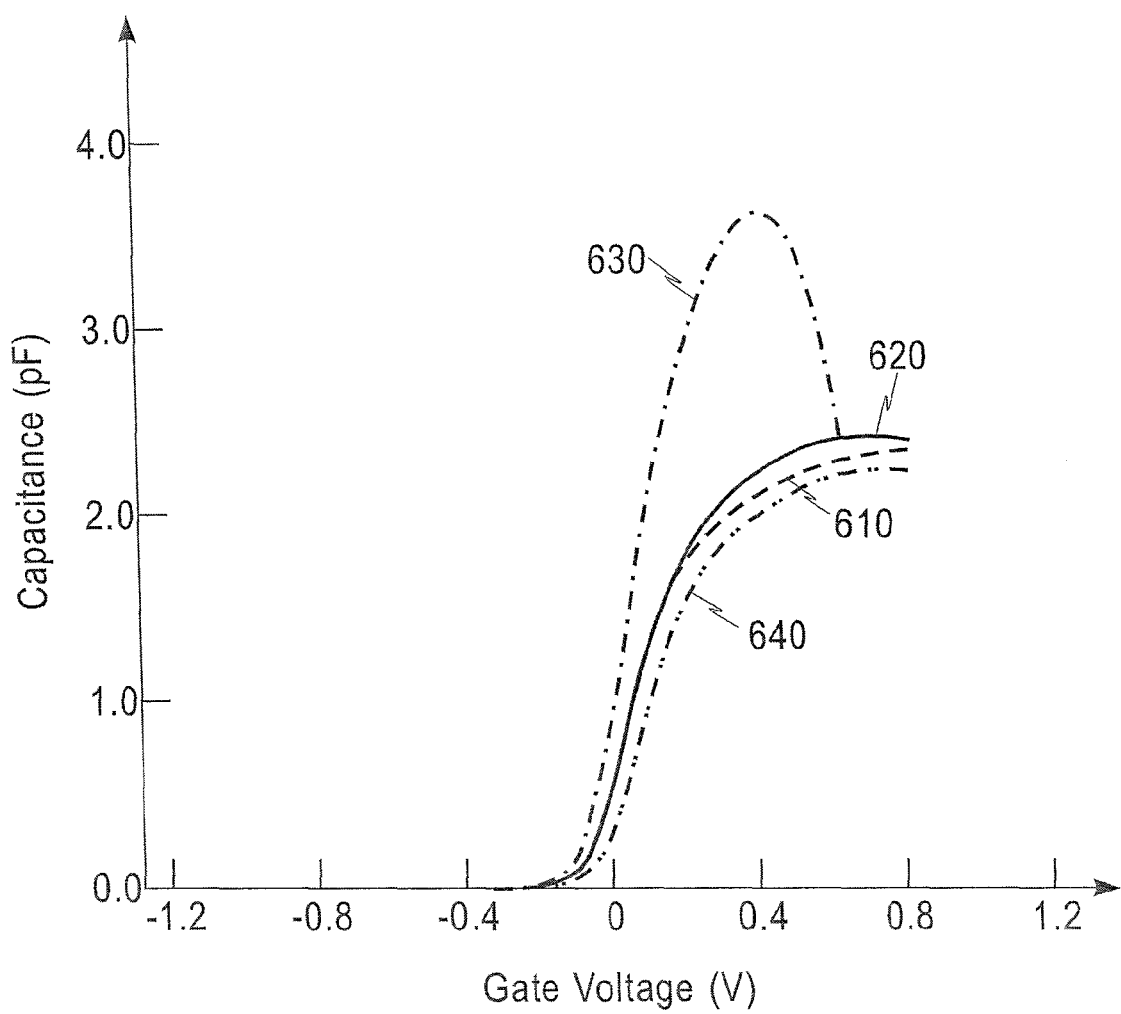
FIG. 6 is a graph showing capacitance as a function of the gate voltage for four types of metal gate electrodes.

Referring to FIG. 6, test data for capacitance as a function of the gate voltage is shown for three types of metal gate electrodes. A first curve 610 shows the capacitance for a reference gate electrode including an 7 nm thick TiN layer enhanced performance. In other words, use of the gate electrode of the invention described in commonly assigned U.S. patent application Ser. No. 12/487,248, which includes a lower metal layer, a scavenging layer, and an upper metal layer, resulted in reduction of EOT compared with a prior art reference structure that employs a single metal layer instead.

In contrast, the effective capacitance achieved by the counterexample gate stacks, as demonstrated by the fourth curve 640, is less than the capacitance achieved by the prior art gate stack, as demonstrated by the first curve 610. Thus, the equivalent oxide thickness (EOT) achieved by the counterexample gate stack is greater than the EOT achieved by the prior art gate stack, providing worse performance. Thus, the importance of the selection of the material for the scavenging metal layer is underscored by the counterexample.

The scavenging metal layer 50 captures oxygen atoms from above and from below, i.e, the scavenging metal layer 50 captures oxygen atoms as the oxygen atoms diffuse through the polycrystalline semiconductor layer 70 and the upper metal layer 60 in the gate electrode toward the high-k gate dielectric 30. Because the scavenging metal layer is more prone to oxide formation than the lower metal layer 40 and the upper metal layer 50, the oxygen atoms are consumed within the scavenging metal layer 50 and the oxygen atoms do not reach the high-k gate dielectric 30. In addition, the scavenging metal layer 50 actively reduces the thickness of the chemical oxide layer 20 underneath the high-k dielectric 30 as additional oxygen atoms migrate toward the chemical oxide layer 20 from below or from the side of the chemical oxide layer 20.

Such migrating oxygen atoms are captured by the scavenging metal layer 50 instead of being incorporated into the chemical oxide layer 20. Not only growth of the chemical oxide layer 20 underneath the high-k gate dielectric 30 is prevented, but the thickness of the chemical oxide layer 20 is reduced as a significant portion of the oxygen atoms in the chemical oxide layer 20 is consumed by the scavenging metal layer 50. Thus, the field effect transistor maintains a constant threshold voltage even after a high temperature anneal in oxygen ambient. By reducing and limiting the thickness of the thickness of the chemical oxide layer 20 than what is normally obtainable by conventional processing, the equivalent oxide thickness (EOT) of a composite gate dielectric stack, which includes the chemical oxide layer 20 and the high-k dielectric 30, is reduced, thereby enhancing the scalability of the composite gate dielectric stack and performance of the field effect transistor.

Figure 7A:
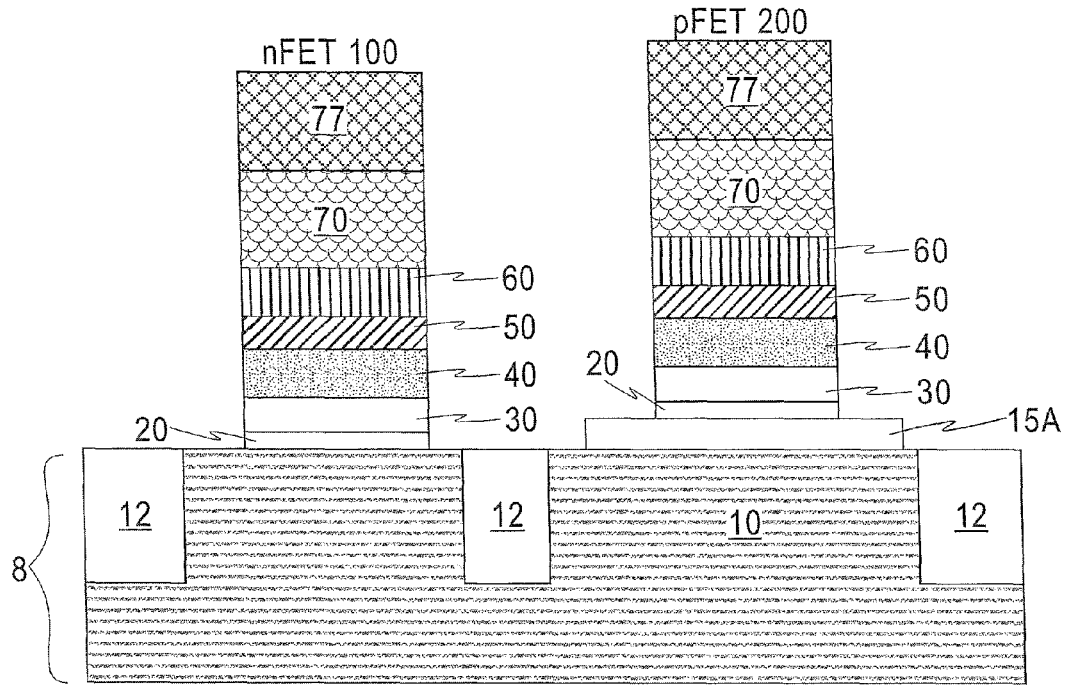
FIGS. 7A and 7B, collectively referred to as FIG. 7, are each a vertical cross-sectional view of the semiconductor structure after patterning of the gate dielectric and the gate electrode similar to FIG. 2, and show an n-type FET (nFET, left) and a p-type FET (pFET, right), where the pFET is to be formed on an epitaxially formed island comprised of SiGe (FIG. 7A) or on a Ge implanted or diffused region within the Si substrate (FIG. 7B).
Figure 7B:
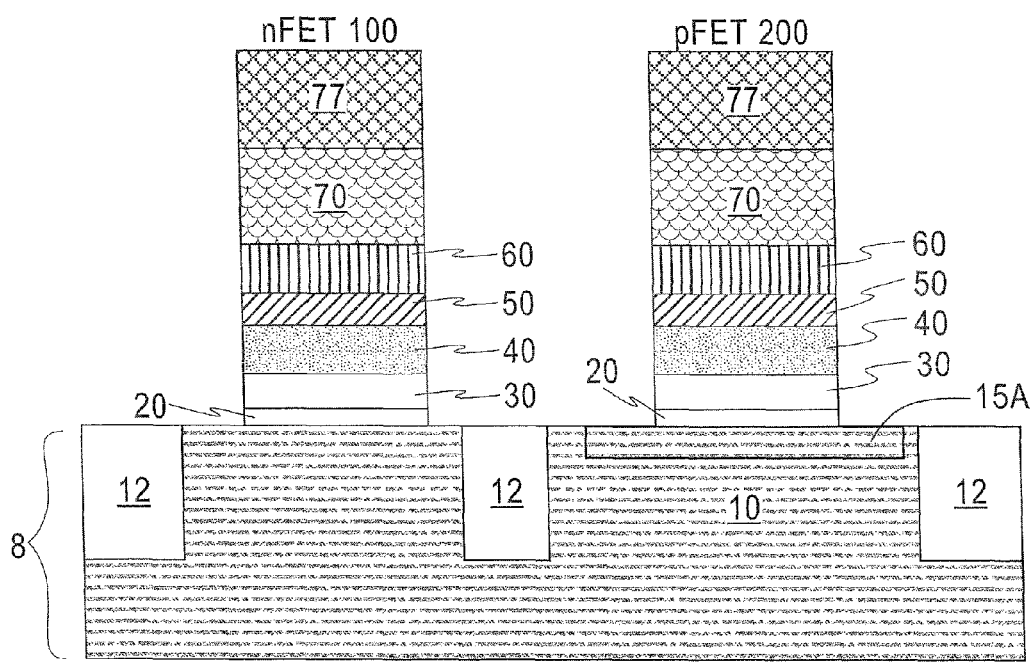

FIGS. 7A and 7B, collectively referred to as FIG. 7, are each a vertical cross-sectional view of the semiconductor structure after patterning of the gate dielectric and the gate electrode similar to FIG. 2, and show an n-type FET (nFET 100, left) and a p-type FET (pFET 200, right), where the pFET 200 is to be formed on an epitaxially grown island 15A comprised of SiGe (FIG. 7A) or on a Ge implanted or diffused region 15B within the Si substrate 10 (FIG. 7B). The SiGe island 15A and the SiGe region 15B each function as the channel for the resulting pFET transistor after further processing in accordance with the process shown and described for FIGS. 3-6 above. The SiGe island 15A and the SiGe region 15B can each have a thickness of up to, for example, about 100 Å. The ratio of Ge to Si in this region can be in a range of, for example, about slightly more than zero to about 40%. There is a Ge—O bond formed in an SiGe interface region between the SiGe region 15A, 15B and the overlying dielectric (e.g., $SiO_2$) layer 20. The SiGe channel region can be doped n-type with, for example, arsenic.

The structure of FIG. 7 is achieved by the selective growth of the SiGe channel in the pFET active area (FIG. 7A) over the Si substrate 10, or by the selective introduction of Ge into the Si substrate 10, such as by implantation or diffusion.

In the illustrated structure of FIG. 7, and in accordance with the examples given above, the substrate 10 can be Si, the layer 20 can be a chemical oxide layer such as $SiO_2$, the layer 30 can be a high dielectric constant (high-k) dielectric layer formed directly on the top surface of the chemical oxide layer 20, the layer 40 can be TiN (e.g., thickness in a range of about 20 Å to about 100 Å) or TiC, the layer 50 contains the scavenging metal M which can be Al (e.g., thickness in a range of about 1 Å to about 20 Å), the layer 60 can be TiN (e.g., thickness in a range of about 20 Å to about 100 Å) or TiC, and the layer 70 can be a polycrystalline semiconductor layer having the photoresist portion 77 which has the shape of a gate electrode to be subsequently formed. An additional STI 12 can be location between the nFET 100 and the pFET 200. In general the metal layer 50 can be an elemental metal layer comprised of Al, Be, Mg, Ca, Sr, Ba, Sc, Y, La, Zr, Hf, Dy, Lu, Er, Pr, and Ce.

As can be seen the same metal gate stack, as described above, is used for both the nFET 100 and the pFET 200.

Figure 8:
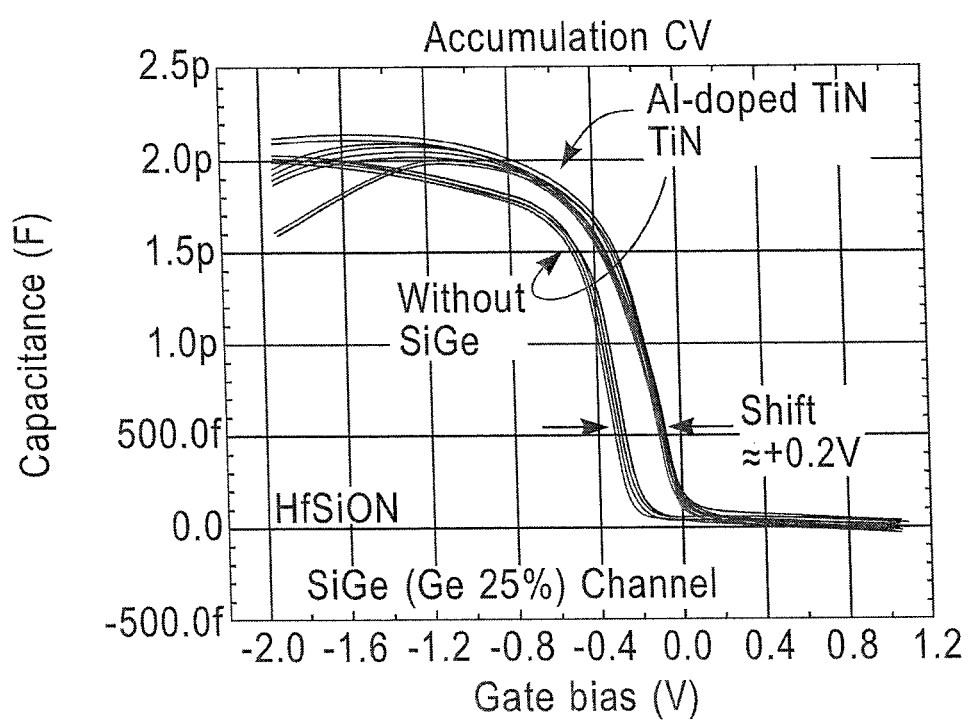
FIGS. 8 and 9 are graphs showing accumulation CV and XPS on exposed high-k dielectric, respectively, and illustrate the effect of oxygen scavenging at a SiGe interface region between SiGe and overlying dielectric.
Figure 9:
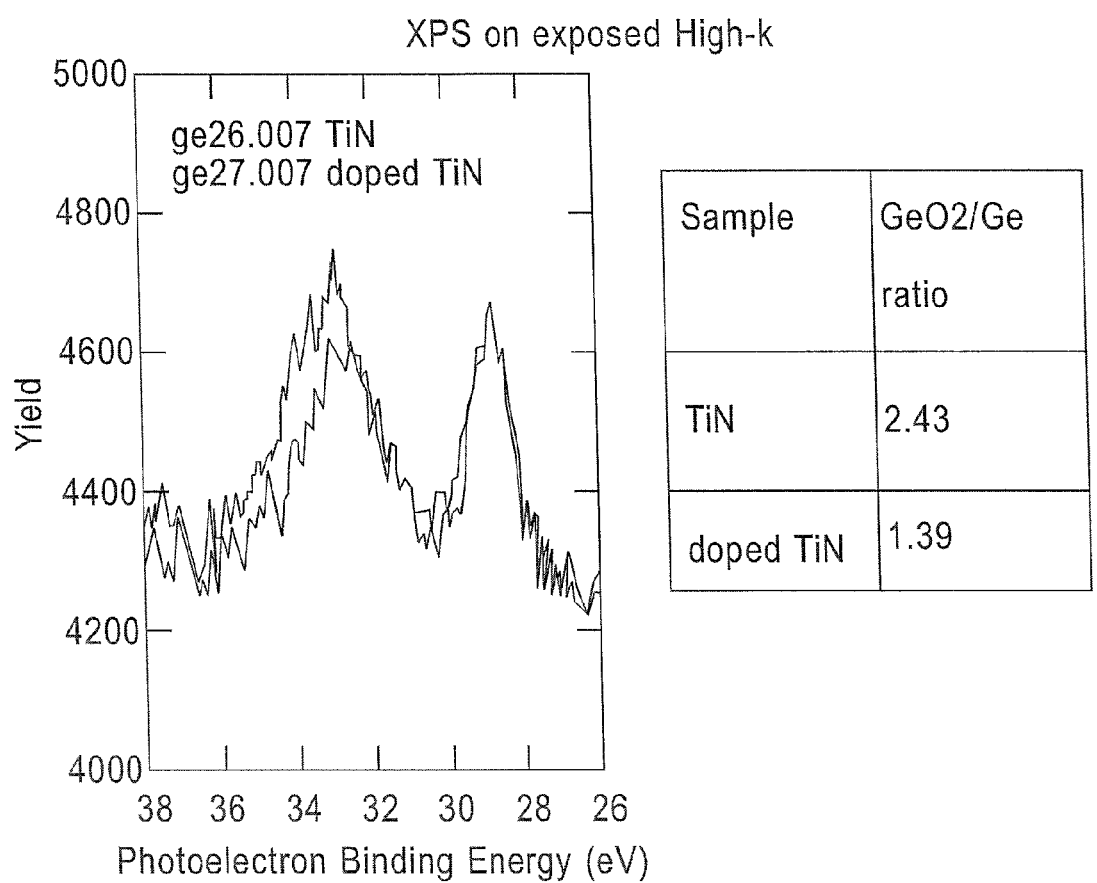

FIGS. 8 and 9 present graphs (FIG. 8, accumulation CV and FIG. 9, XPS on exposed high-k dielectric) that show the effect of oxygen scavenging at the SiGe interface region between the SiGe region 15A, 15B and the overlying dielectric (e.g., $SiO_2$) layer 20 for an exemplary and non-limiting case of a Si—Ge ratio of 75-25. The equivalent oxide thickness (EOT) scaling (which correlates with $T_{inv}$) and positive flat band voltage ($V_{fb}$) shift (i.e., pFET $V_t$ lowering) were obtained with the Aluminum-doped TiN electrode on the SiGe (Ge 25%) channel 15A or 15B. The electrical data correlate with a reduction of the Ge—O bond intensity due to scavenging by the M layer 50. Note in FIG. 8 the approximately 200 mV shift in gate bias for a given value of capacitance between the TiN-only (without the SiGe layer present) and the Al-doped TiN gate electrode (with the SiGe layer present). The chart in FIG. 9 shows the reduction in the $GeO_2$/Ge ratio in the SiGe interface region between the SiGe region 15A, 15B and the overlying dielectric (e.g., $SiO_2$) layer 20 for the case of a conventional TiN electrode (ratio is 2.43) versus the enhanced TiN/M/TiN (doped TiN) electrode (ratio is 1.39) that is disclosed in the commonly assigned U.S. patent application Ser. No. 12/487,248.

The SiGe channel can provide a roughly 350 mV shift, while an additional about 200 mV shift is obtained by the use of the SiGe channel with the Al-doped TiN gate electrode.

Figure 10A:
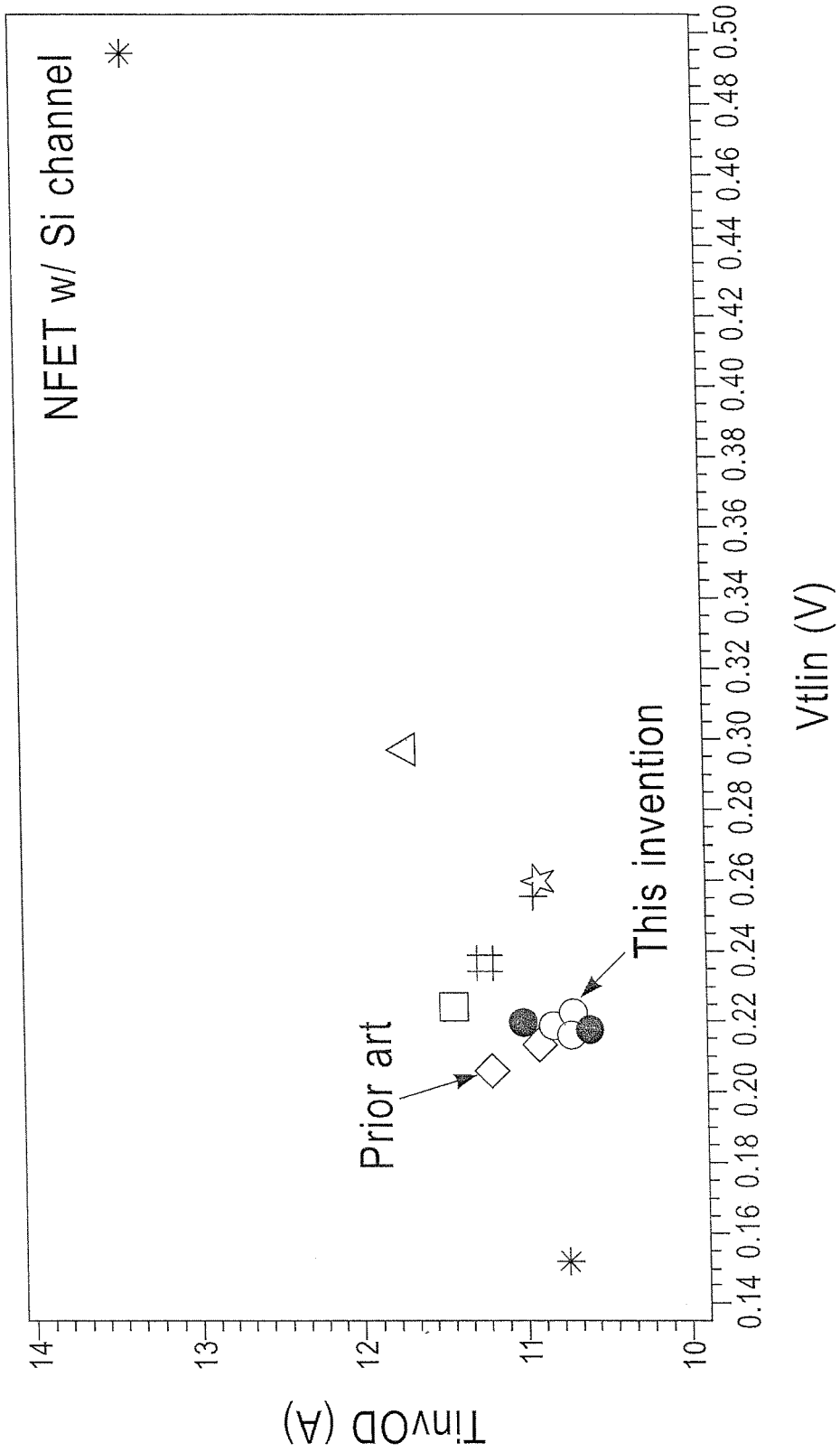
FIGS. 10A and 10B, collectively referred to as FIG. 10, are graphs depicting CMOS characteristics for an nFET, with a Si channel, and a pFET, with a SiGe channel, and show $T_{inv}$ scaling and $V_t$ lowering that are obtained for the pFET while changing by only a small amount the nFET $V_t$.
Figure 10B:
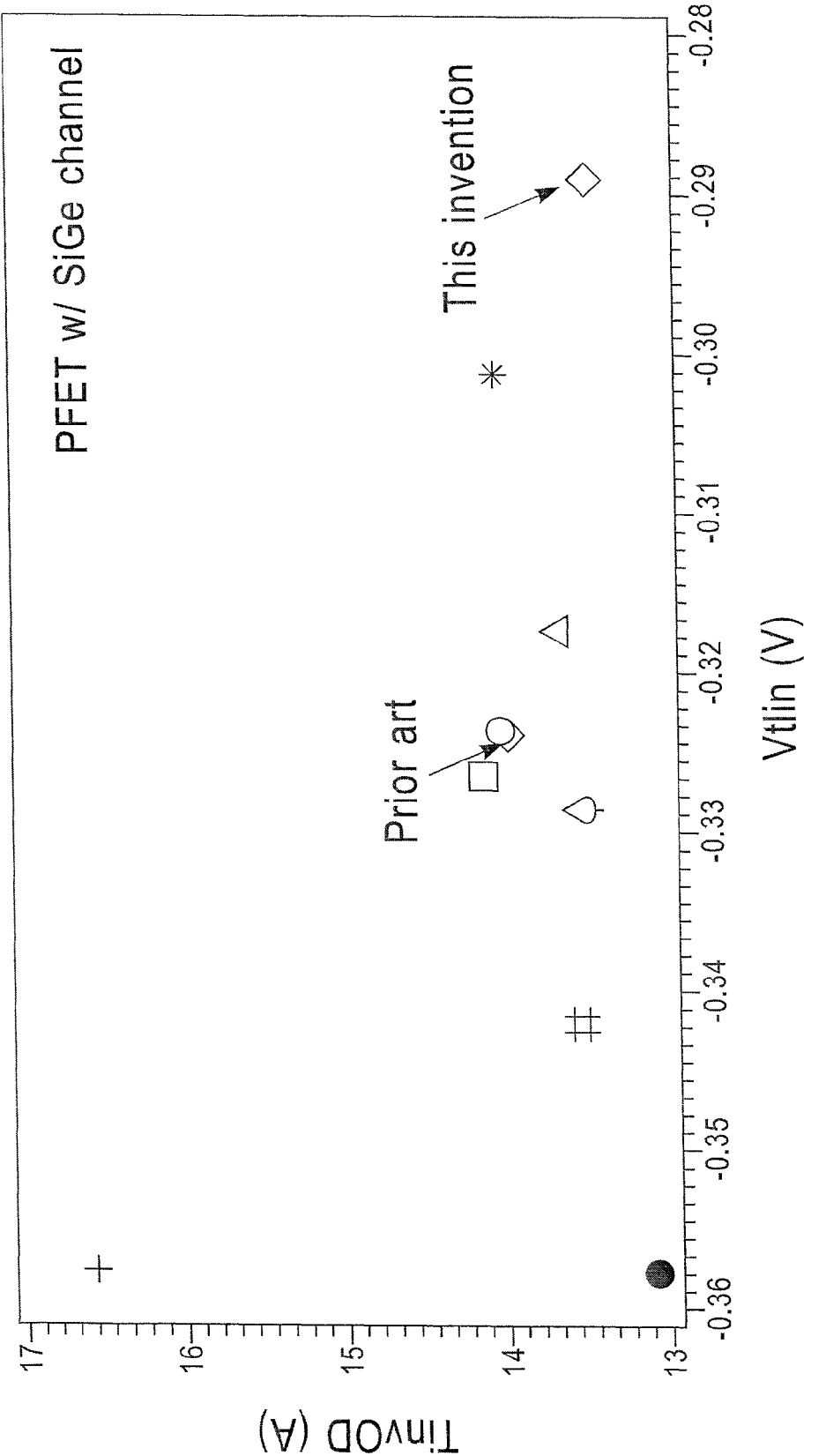

FIGS. 10A and 10B are graphs depicting CMOS characteristics for the nFET 100, with the Si channel, and the pFET 200, with the SiGe channel, and show the $T_{inv}$ scaling and $V_t$ lowering that are obtained for the pFET 200 (as compared to a prior art) while changing by only a small amount the nFET $V_t$ (as compared to a prior art) by the use of the Al-doped TiN gate electrode. FIG. 10 clearly shows that the goal of making the Vt of the nFET 100 and the pFET 200 approximately equal is achieved by the use of the exemplary embodiments of this invention.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor structure comprising:
   providing a semiconductor substrate comprising a semiconductor material;

forming a p-type field effect transistor (pFET) disposed upon said semiconductor substrate and comprising a semiconductor channel region comprised of SiGe formed upon or within a surface of said semiconductor substrate;

forming a gate dielectric comprising an oxide layer overlying said semiconductor channel region comprised of SiGe and a high dielectric constant (high-k) dielectric layer overlying said oxide layer; and forming a gate electrode overlying said high-k dielectric layer and comprising a lower metal layer abutting said high-k dielectric layer, a scavenging metal layer abutting said lower metal layer, and an upper metal layer abutting said scavenging metal layer, wherein said scavenging metal layer includes a metal (M) for which the Gibbs free energy change of the chemical reaction, in which a silicon atom combines with a metal oxide material including said scavenging metal and oxygen to form said scavenging metal in elemental form and silicon dioxide, is positive;

forming an n-type field effect transistor (nFET) to be disposed upon said semiconductor substrate and comprising a semiconductor channel region comprised of Si, where a gate electrode of said nFET also comprises said scavenging metal layer; and performing a high temperature anneal of the semiconductor structure in an oxygen ambient forming a metal oxide of the scavenging metal layer, wherein the scavenging metal layer is more prone to forming a metal oxide than the upper metal layer and the lower metal layer and forms the metal oxide within the scavenging layer by scavenging impurity oxygen atoms that diffuse through the upper metal layer toward the high-k dielectric layer and scavenges oxygen from the oxide layer as oxygen atoms migrate towards the oxide layer from below or from the side of the oxide layer to limit growth of the oxide layer during the high temperature anneal in oxygen ambient.

2. The method of claim 1, where said lower metal layer is comprised of TiN and has a thickness in a range of about 20 Å to about 100 Å and said scavenging metal layer is comprised of Al and has a thickness in a range of about 1 Å to about 20 Å.

3. The method of claim 2, where said upper metal layer is comprised of TiN and has a thickness in a range of about 20 Å to about 100 Å.

4. The method of claim 2, where said semiconductor channel region has a thickness of up to about 100 Å and has a ratio of Ge to Si in a range of about zero to about 40%.

5. The method of claim 1, where said lower metal layer and said upper metal layer are comprised of the same material.

6. The method of claim 1, where said scavenging metal layer is comprised of a metal in an elemental form.

7. The method of claim 1, where said lower metal layer and said upper metal layer are comprised of TiN or TiC, or a combination thereof, and wherein said scavenging metal layer includes a metal in an elemental form and is selected from Al, Be, Mg, Ca, Sr, Ba, Sc, Y, La, Zr, Hf, Dy, Lu, Er, Pr, and Ce.

8. The method of claim 1, where said high-k dielectric layer comprises one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, an alloy thereof, and non-stoichiometric variants thereof, wherein each value of x is independently from 0.5 to 3 and each value of y is independently from 0 to 2.

9. The method of claim 1, where forming said gate electrode further forms a doped polycrystalline semiconductor layer vertically abutting said upper metal layer.

10. The method of claim 1, further comprising forming a dielectric spacer laterally abutting and surrounding said gate electrode overlying said semiconductor channel region and comprising an oxygen-impermeable material; a source region located in said semiconductor substrate and abutting a peripheral portion of said gate spacer; and a drain region located in said semiconductor substrate and abutting another peripheral portion of said gate spacer.

\* \* \* \* \*